(12) United States Patent
Hall et al.

(10) Patent No.: US 7,586,191 B2
(45) Date of Patent: Sep. 8, 2009

(54) INTEGRATED CIRCUIT APPARATUS WITH HEAT SPREADER

(76) Inventors: David R. Hall, 2185 S. Larsen Pkwy., Provo, UT (US) 84606; H. Tracy Hall, 2185 S. Larsen Pkwy., Provo, UT (US) 84606; Paul Moody, 2185 S. Larsen Pkwy., Provo, UT (US) 84606; Scott Dahlgren, 2185 S. Larsen Pkwy., Provo, UT (US) 84606; Marshall Soares, 2185 S. Larsen Pkwy., Provo, UT (US) 84606

(*) Notice: Subject to any disclaimer, the term of this patent is extended or adjusted under 35 U.S.C. 154(b) by 502 days.

(21) Appl. No.: 11/161,671

(22) Filed: Aug. 11, 2005

(65) Prior Publication Data

US 2007/0035011 A1 Feb. 15, 2007

(51) Int. Cl.
*H01L 23/34* (2006.01)
(52) U.S. Cl. .............. 257/720; 257/E23.101; 257/706; 257/707; 257/712; 361/723
(58) Field of Classification Search .......... 257/E23.105, 257/706, 707, 712, 713, 717, E23.101, E23.08, 257/E23.051, 720; 361/723; 29/827; 174/16.3, 174/524; 228/18.22
See application file for complete search history.

(56) References Cited

U.S. PATENT DOCUMENTS

| | | | |
|---|---|---|---|
| 4,104,344 A * | 8/1978 | Pope et al. .................. 264/42 |
| 4,689,276 A | 8/1987 | Jacquez | |
| 5,229,643 A * | 7/1993 | Ohta et al. .................. 257/706 |
| 5,299,091 A * | 3/1994 | Hoshi et al. ................. 361/723 |
| 6,049,639 A * | 4/2000 | Paniccia et al. .............. 385/14 |
| 6,627,989 B2 * | 9/2003 | Kohno et al. ................ 257/706 |
| 6,800,886 B2 * | 10/2004 | Awano ...................... 257/276 |
| 7,040,381 B2 * | 5/2006 | Eisele et al. ............... 165/80.4 |
| 7,327,027 B2 * | 2/2008 | Houle et al. ................ 257/712 |
| 2002/0171153 A1 * | 11/2002 | Kikuchi et al. ............. 257/778 |
| 2003/0146520 A1 * | 8/2003 | Fang ...................... 257/778 |
| 2003/0209802 A1 * | 11/2003 | Awano ...................... 257/712 |
| 2004/0040327 A1 * | 3/2004 | Iida et al. .................. 62/259.2 |
| 2004/0262743 A1 * | 12/2004 | Houle et al. ................ 257/712 |

\* cited by examiner

*Primary Examiner*—Chris C Chu
(74) *Attorney, Agent, or Firm*—Tyson J. Wilde; Paul M. Schramm

(57) ABSTRACT

An integrated circuit apparatus with heat removal has an electrical interconnection network. The electrical interconnection network has a plurality of electrically and thermally conductive vias in electrical communication with terminals of at least one semiconductor device. An electrically insulating heat spreader is chemically bonded to each of the vias at an upper layer of the electrical interconnection network. At the upper layer the vias are electrically isolated from each other. In some embodiments the electrically insulating heat spreader is a polycrystalline diamond body with a metallized undersurface. The metallized undersurface may be etched away between vias.

24 Claims, 16 Drawing Sheets

INTEGRATED CIRCUIT APPARATUS WITH HEAT SPREADER

BACKGROUND OF THE INVENTION

1. Field of the Invention

The present invention relates to semiconductor devices. More specifically, it relates to heat removal in semiconductor devices.

2. Description of the Related Art

The advent of semiconductor devices and the analogue and digital functions enabled by them have revolutionized many contemporary industries and improved the general quality of life for many people. As technology has become increasingly more refined and developed, the performance requirements placed on semiconductor devices in order to implement this technology have also increased.

In Very Large Scale Integration (VLSI) integrated circuits, thousands or even millions of semiconductor devices such as transistors may be built on a common substrate. These semiconductor devices generally produce heat energy when they are conducting current or switching between states. As device size has decreased and more and more semiconductor devices are being fabricated on chips, the issue of heat removal from the integrated circuits has become a greater concern. Semiconductor devices may be fabricated in very close proximity to other devices. As a result, heat produced by one device may adversely affect the performance of a neighboring device. Excessively high temperatures in an integrated circuit may cause voids to form in metal wiring or excessive amounts of leakage current. Both of these as well as other high-temperature related problems may lead to improper functionality or even failure of integrated circuits.

A heat sink is a good thermal conductor that aids in the dissipation of heat energy through the principles of conduction and convection. It is not uncommon for areas of greater heat concentration, or "hot spots," to develop on the face of a semiconductor device. In order to improve heat transfer into a heat sink for dissipation, a heat spreader is often used in conjunction with a heat sink. Heat spreaders are thermally conductive interface elements that attach to both the semiconductor device face and the heat sink. Due to their high thermal conductivity, heat spreaders typically spread heat energy from the "hot spots" on a semiconductor device over their entire volume to more efficiently transfer the heat energy to the heat sink.

Several potential solutions to the problem of heat removal in an integrated circuit are known in the art. Many involve the use of one or more heat sinks and/or heat spreaders.

U.S. Pat. No. 6,333,557 to Sullivan, which is herein incorporated by reference for all it discloses, includes a system wherein one or more cooling posts, e.g., multiple thermally conductive plugs are selectively disposed within a semiconductor chip structure adjacent to one or more electrically conductive levels and thermally coupled thereto so that heat produced by conductive lines within the wiring levels is transferred into and through the cooling posts for forwarding to a supporting substrate, which may have a back surface coupled to a cold plate, or to an upper surface of the semiconductor chip structure.

U.S. Pat. No. 6,211,569 to Lou, which is herein incorporated by reference for all it discloses, teaches of a structure of metal interconnection lines in which a silicon nitride layer is formed underneath a first metal pattern of integrated circuits. A silicon nitride plug is formed between two adjacent metal patterns and it serves as a thermal conductor. At least one metal plug in the dielectric layers between the metal patterns is an electrical connection of the integrated circuits.

U.S. Pat. No. 5,955,781 to Joshi, et al., which is herein incorporated by reference for all it discloses, teaches a semiconductor chip structure with at least one thermal conductor embedded within the semiconductor chip structure, the thermal conductor providing electrical insulation and a plurality of devices formed within the structure adjacent to the thermal conductor such that during operation heat produced in the devices is transferred into and through the thermal conductor to reduce the operating temperature of the devices. The thermal conductor is preferably diamond deposited by vapor phase process (CVD). The device is preferably a silicon-on-insulator device. Diamond may also be deposited into channels cut or etched in the back of the substrate.

U.S. Pat. No. 5,621,616 to Owens, et al., which is herein incorporated by reference for all it discloses, teaches of a thermally conductive metal frame in one of the metallization layers that gathers heat produced in the circuit. A plug member penetrates through the layer of insulative material and extends into a hole formed in the semiconductor substrate. This plug member is in conductive heat transfer relation with the material of the semiconductor substrate, and connects thermally with a heat sink.

BRIEF SUMMARY OF THE INVENTION

An integrated circuit apparatus comprises an electrical interconnection network comprising a plurality of electrically and thermally conductive vias. The vias are in electrical communication with terminals of one or more semiconductor devices such as transistors or diodes. An electrically insulating heat spreader is chemically bonded to each of the vias at an upper layer of the electrical interconnection network. At the upper layer the vias are electrically isolated from each other.

It should be understood that for the purposes of this specification, the term "thermally conductive" refers to a material having a characteristic thermal conductivity greater than that of silicon dioxide.

It should be further understood that for the purposes of this invention the term "electrically insulating heat spreader" refers to a heat spreader in which electrical components (such as wires, terminals, etc.) may be attached to the heat spreader and retain electrical isolation from each other.

The electrical interconnection network may comprise a plurality of electrically isolated levels with electrical conductors interconnecting specific vias according to a circuit configuration. The electrically isolated levels may be separated by a dielectric material. The electrical conductors may comprise metal layers of wiring.

In the preferred embodiment, the electrically insulating heat spreader is a polycrystalline diamond with a metallized undersurface. The apparatus preferably comprises a chemical bond between the metallized undersurface and the vias such as a solder joint. The metallized undersurface may be etched away between vias to electrically isolate the vias from each other at the upper level and to provide an additional level of interconnection to the semiconductor device.

During normal operation of the semiconductor device, heat may be transferred from the terminals of the semiconductor device, through the vias, to the heat spreader where it may be dissipated into a fluid. The electrically insulating thermally conductive element may be actively cooled by a circulating fluid coolant such as air water, liquid nitrogen, etc.

DETAILED DESCRIPTION OF THE INVENTION AND THE PREFERRED EMBODIMENT

The attached figures in which like elements are labeled with like numerals and the following description of said figures are intended to illustrate certain embodiments of the invention and not to limit its scope.

Figure 1:
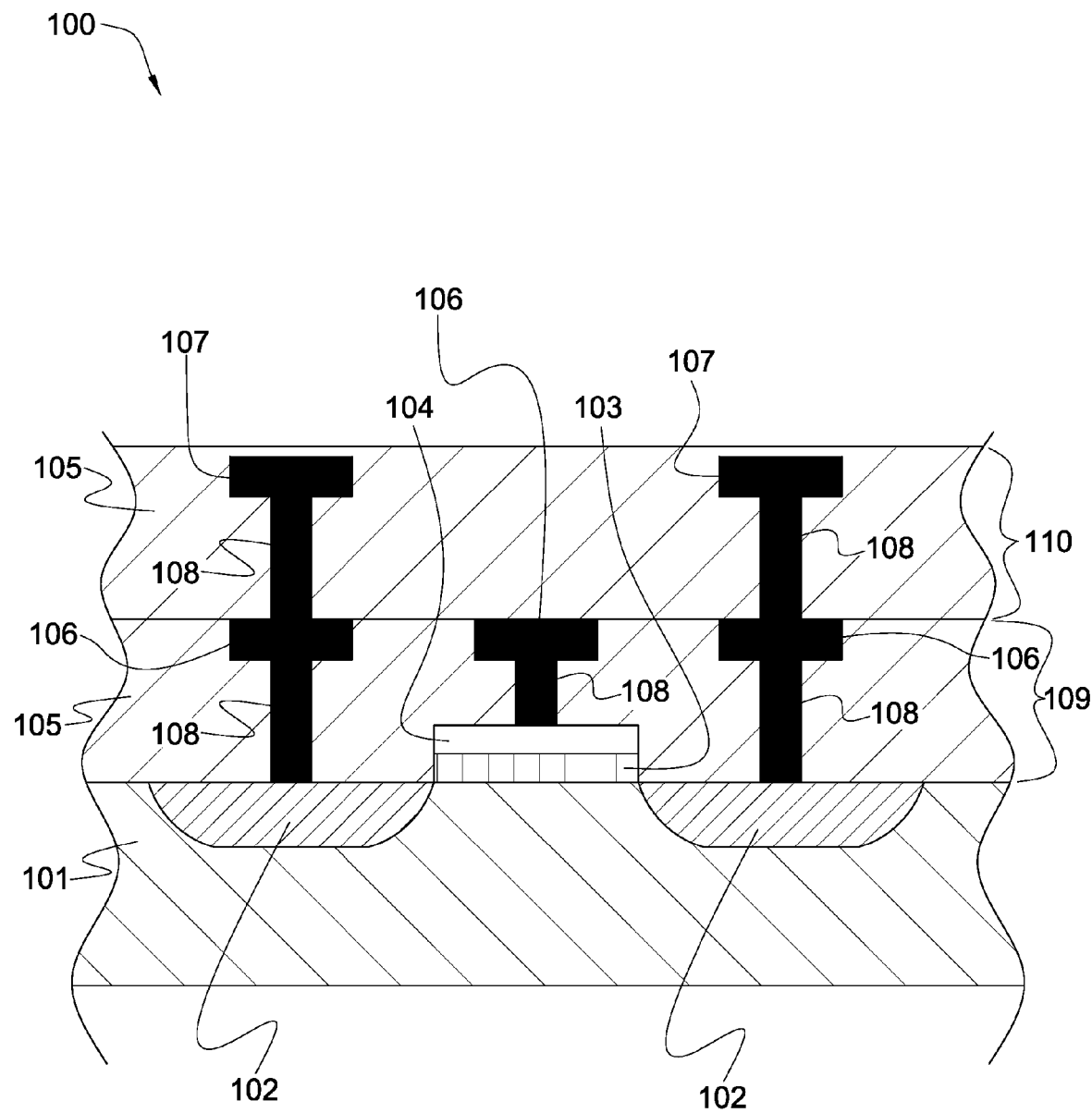
FIG. 1 is a cross-sectional diagram of a typical prior art integrated circuit apparatus.

Referring now to FIG. 1, a typical prior art semiconductor device 100 may be fabricated on a substrate 101 and comprise terminals 102, 104. The portion depicted of the embodiment shown comprises doped well terminals 102 and a transistor gate structure terminal 104. A dielectric material 103 may separate the transistor gate structure 103 from the substrate 101. While only a few terminals 102, 104 are depicted here for the sake of clarity, it should be understood that a normal semiconductor device 100 may have hundreds, thousands, or even millions of terminals 102, 104. Typically in the art, these terminals 102, 104 may be interconnected to perform predetermined logical functions through an interconnection network of electrical conductors 106, 107 and vias 108.

The electrical conductors are typically arranged in electrically isolated layers 109, 110, which are also known in the art as metal layers. The electrically isolated layers 109, 110 may comprise a dielectric material 105 that insulates electrical conductors 106, 107 from each other. Vias 108 may be electrically conducting and transcend electrically isolated layers 109, 110 to connect with the terminals 102, 104. Electrical conductors 106, 107 of the electrically isolated layers 109, 110 interconnect specific vias 108 according to a circuit configuration.

Figure 2:
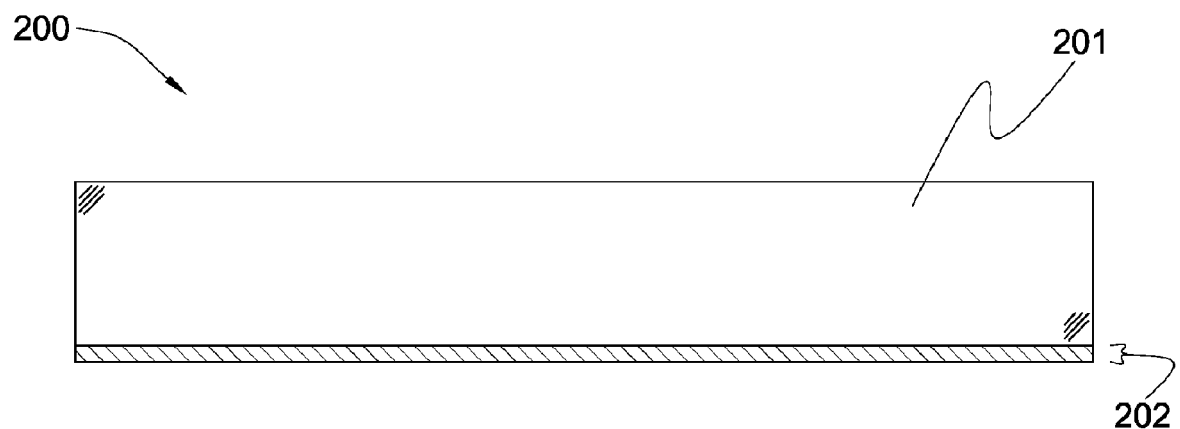
FIG. 2 is a cross-sectional diagram of a heat spreader with a metallized undersurface.

Referring now to FIG. 2, a cross-sectional diagram of an embodiment of a heat spreader 200 is shown. The heat spreader 200 may comprise an electrically insulating thermally conductive material 201 with a metallized undersurface 202. The electrically insulating thermally conductive material 201 may comprise diamond. More specifically, the electrically insulating thermally conductive material 201 may comprise polycrystalline diamond (PCD). Heat spreaders are typically made out of a material with high thermal conductivity to facilitate both the collection of heat energy from a source and the dissipation of the heat energy to a surrounding ambient through a heat sink. Diamond may act as both an effective thermal conductor and an electrical insulator. In other embodiments the electrically insulating thermally conductive material 201 may comprise a thermal conductor such as single-crystal diamond or a single-crystal or polycrystalline ceramic.

The metallized undersurface 202 may comprise a layer of metal deposited on the electrically insulating thermally conductive material 201 through a method such as chemical vapor deposition (CVD), vacuum evaporation, sputtering, electroplating, or electroless plating. The metallized undersurface 202 may comprise aluminum, nickel, titanium, tungsten, gold, silver, copper, nickel and alloys thereof. Preferably the metallized undersurface 202 is chemically bonded to the electrically insulating thermally conductive material 201.

For the purposes of this invention the term "electrically insulating heat spreader" means a thermally conductive element to which electrical components (such as wires, terminals, etc.) may be attached and retain electrical isolation from each other. The electrically insulating heat spreader may be designed especially to provide separate portions to which individual electrical and/or thermal conductors may bond while maintaining electrical isolation between the individual conductors.

Figure 3:
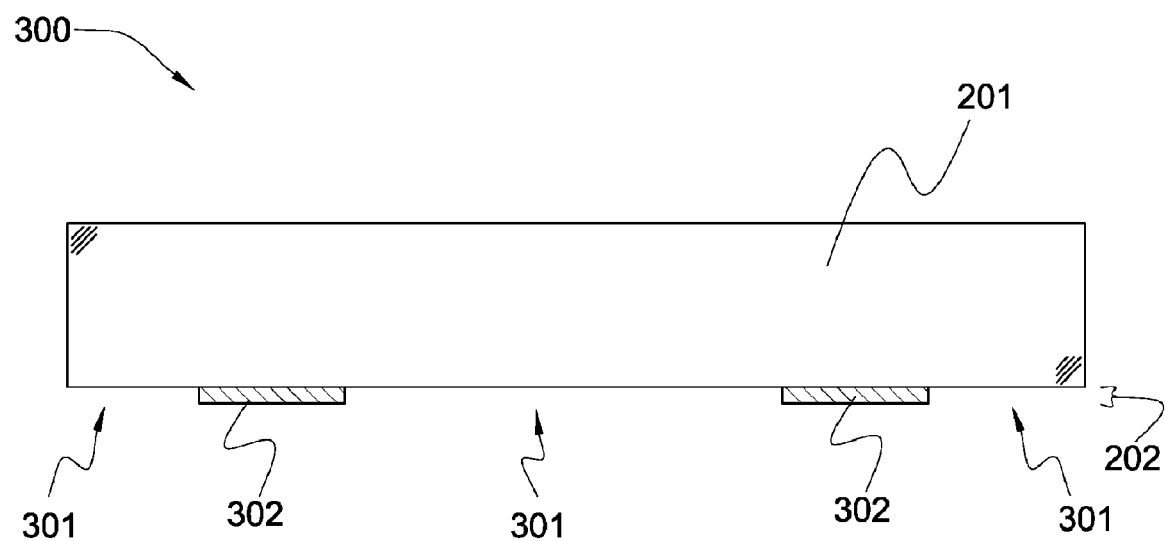
FIG. 3 is a cross-sectional diagram of an electrically insulating heat spreader with portions of the metallized undersurface etched away.
Figure 4:
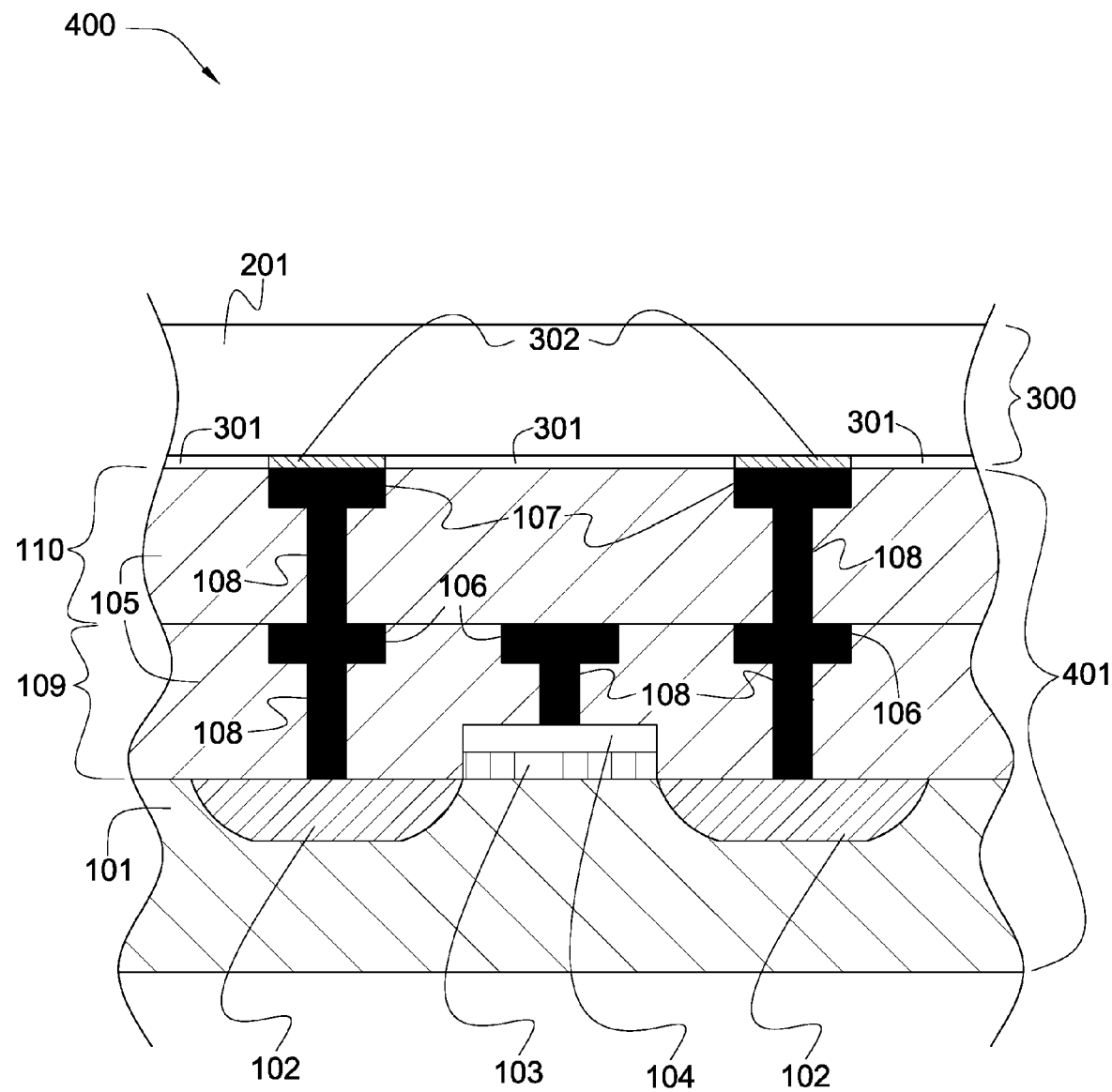
FIG. 4 is a cross-sectional diagram of one embodiment of an integrated circuit apparatus.

For example, referring now to FIGS. 3-4, one embodiment of an electrically insulating heat spreader 300 may comprise an electrically insulating thermally conductive (EITC) material 201 with metallized undersurface 202 comprising segments 302. The metallized undersurface 202 may be etched away in certain regions 301 to create the metallized undersurface segments 302 in specific areas of the spreader 300. This may be done by chemical etching or by mechanical machining or abrasion. In other embodiments the metallized undersurface segments 302 may be grown or deposited on the electrically insulating thermally conductive material 201 according to a desired pattern and thus bypass any need of later etching. In other embodiments, the heat spreader 300 may be leached to form recesses in which the metallized undersurface segments 302 may be formed.

Referring to FIG. 4, the resulting segments 302 may provide a means by which electrically and thermally conductive vias 108 in a semiconductor device 401 may bond to the metallized undersurface 202 while maintaining electrical isolation from each other. The vias 108 may comprise a material selected from the group consisting of titanium, tungsten, gold, silver, aluminum, copper, and alloys thereof. These metals generally tend to be fairly thermally conductive and to bond well to other metals. For this reason the metallized undersurface segments 302 may provide a good interface between the vias 108 and the thermally conductive electrically insulating material 201 of the heat spreader 300. The electrically and thermally conductive vias 108 may chemically bond to the metallized undersurface segments 302.

The chemical bond between the vias 108 and the metallized undersurface segments may have multiple functions, such as providing mechanical strength to the semiconductor device 401 from the heat spreader 300 as well as providing an interface for the transfer of thermal energy. The chemical bond between the vias 108 and the metallized undersurface segments 302 may comprise solder. The solder may comprise a material selected from the group consisting of indium, lead, tin, eutectic alloys, and combinations thereof. A solder joint may provide an interface material between the vias 108 and the heat spreader 300.

The contacting surfaces on the vias 108 and the heat spreader 300 may not be perfectly planar, resulting in the possibility for a small gap between some of the vias 108 and the matching contacting surfaces 302 of the heat spreader 300. Such gaps would resist the flow of heat from the vias 108 to the heat spreader 300 and would also interfere with electrical functions of the device. The interface from a solder joint or other chemical bond will substantially reduce thermal resistance at junctions between vias 108 and the heat spreader.

The metallized undersurface 202 of the heat spreader 300 may be relatively very thin compared to the thermally conductive electrically insulating material 201, thereby minimizing any effects of thermal impedance from the metallized undersurface 202 and any solder material at a joint between vias 108 and the heat spreader 300.

It can thus be seen that the integrated circuit apparatus 400 of FIG. 4 represents the integration of the heat spreader 300 of FIG. 3 with a semiconductor device 401 similar to that of FIG. 1. Terminals 102, 104 may include doped wells 102 in semiconductor substrate 101 and a transistor gate structure 104. A dielectric material 103 (e.g. silicon dioxide) may separate the transistor gate structure 104 from the semiconductor substrate 101. The transistor gate structure 104 may comprise polysilicon. The semiconductor device 401 may also comprise other terminals such as anodes, cathodes, drains, sources, collectors, emitters, bases, substrates, and combinations thereof (not shown).

The semiconductor device may be selected from the group consisting of silicon-on-insulator (SOI) devices, silicon-on-sapphire (SOS) devices, silicon-on-diamond (SOD) devices, complementary metal oxide semiconductor (CMOS) devices, gallium arsenide (GaAs) devices, bipolar junction transistor (BJT) devices, junction field effect transistor (JFET) devices and combinations thereof.

Electrically and thermally conductive vias 108 are in electrical communication with the terminals 102, 104. The semiconductor device comprises an electrical interconnection network of a plurality of electrically isolated levels 109, 110 with electrical conductors 106, 107 interconnecting specific electrically and thermally conductive vias 108 according to a circuit configuration. Each electrically isolated level 109, 110 may comprise a layer of electrical conductors 106, 107 separated from other layers of electrical conductors 106, 107 by a dielectric material 105. The dielectric material may be silicon dioxide ($SiO_2$).

Due to the dielectric nature of the electrically insulating thermally conductive material 201 in the heat spreader 300, electric current flow between any two metallized undersurface segments 302 in the heat spreader 300 is prevented. It may be essential to maintain electrical isolation between vias 108. This electrical isolation may prevent the integrated circuit apparatus 400 from malfunctioning due to short circuits between specific vias 108. Undersurface segments 302 may even comprise an additional layer of metallization and interconnection to semiconductor device 401. It may also provide the electrical interface between device 401 and external circuitry.

The displayed terminals 102, 104 in this cross-sectional view of the semiconductor device 401 may be representative of thousands or even millions of terminals 102, 104 in the semiconductor device 401. Heat generated at terminals 102, 104 will be conducted to the heat spreader 300 through the thermally and electrically conductive vias 108. Heat energy will follow a path of least resistance in flowing from the point of higher temperature at the terminals 102, to a point of lower temperature at the heat spreader 300. The vias 108 have higher thermally conductivity than the dielectric material 105, and the path of least resistance will be through the vias 108. Thus heat that is produced at terminals 102 will be conducted through the vias 108 to the heat spreader 300.

Figure 5:
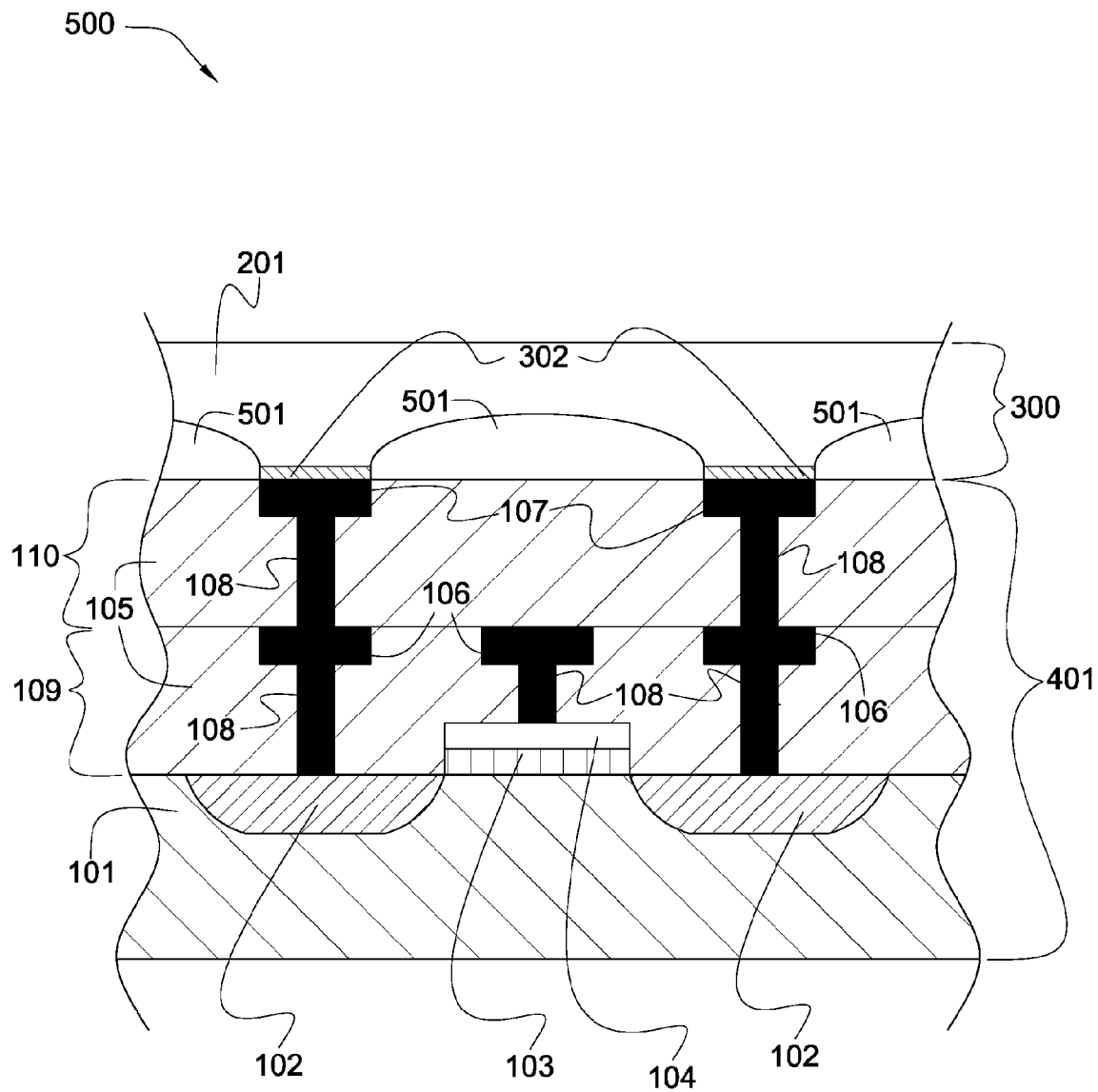
FIG. 5 is a cross-sectional diagram of another embodiment of an integrated circuit apparatus.

Referring now to FIG. 5, another embodiment of an integrated circuit apparatus 500 comprises the semiconductor device 401 of FIG. 4 with a heat spreader 300 comprising one or more arched recesses 501 between vias 108. The heat spreader 300 may comprise a polycrystalline diamond with a metallized undersurface 202. Polycrystalline diamond may be sintered in various shapes and sizes. A heat spreader 300 comprising polycrystalline diamond with a metallized undersurface 202 and arched recesses 501 between metallized undersurface segments 302 may be ideal for some applications of this invention. For example, in some embodiments, heat that is transferred from the semiconductor device 401 to the heat spreader 300 may be dissipated to a heat sink by an actively circulating coolant fluid such as air. The fluid may also flow through the arched recesses of the heat spreader and further contribute to the dissipation of the heat energy. For purposes of this invention, "arched" refers to any cross-sectional shape that permits fluid to form at the interface between head spreader 300 and semiconductor device 401.

Figure 6:
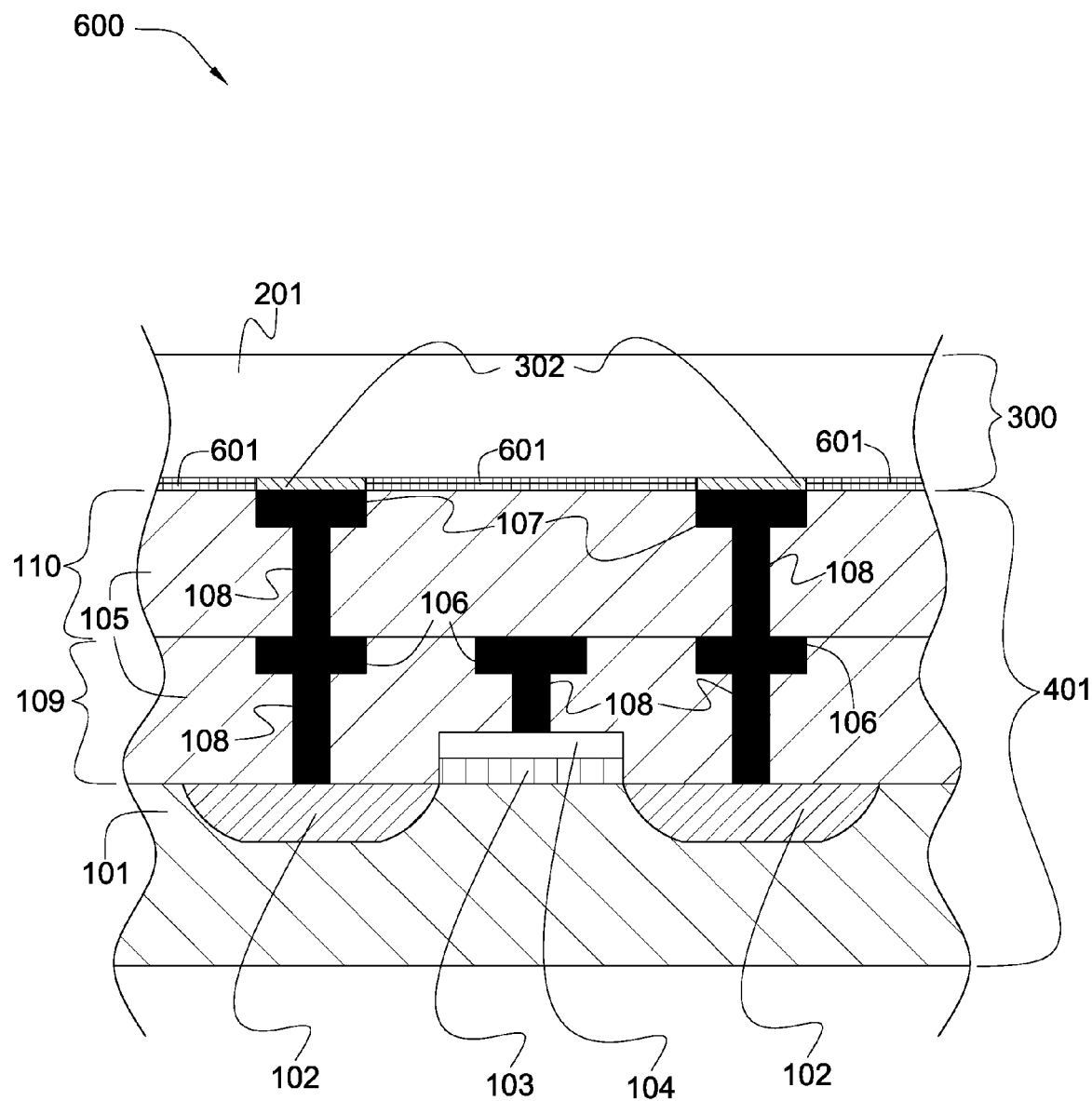
FIG. 6 is a cross-sectional diagram of another embodiment of an integrated circuit apparatus.

Referring now to FIG. 6, another embodiment of an integrated circuit apparatus 600 may comprise the semiconductor device 401 of FIG. 4 and a heat spreader 300 like that of FIG. 3. The metallized undersurface segments 302 of the heat spreader 300 may chemically bond to individual vias 108 as in FIG. 4. Additionally, certain regions of the heat spreader 300 between segments 302 may comprise a bonding material 601 that attaches to the integrated circuit apparatus 600. The bonding material 601 should be electrically insulating in order to preserve electrical isolation of the vias 108.

Figure 7:
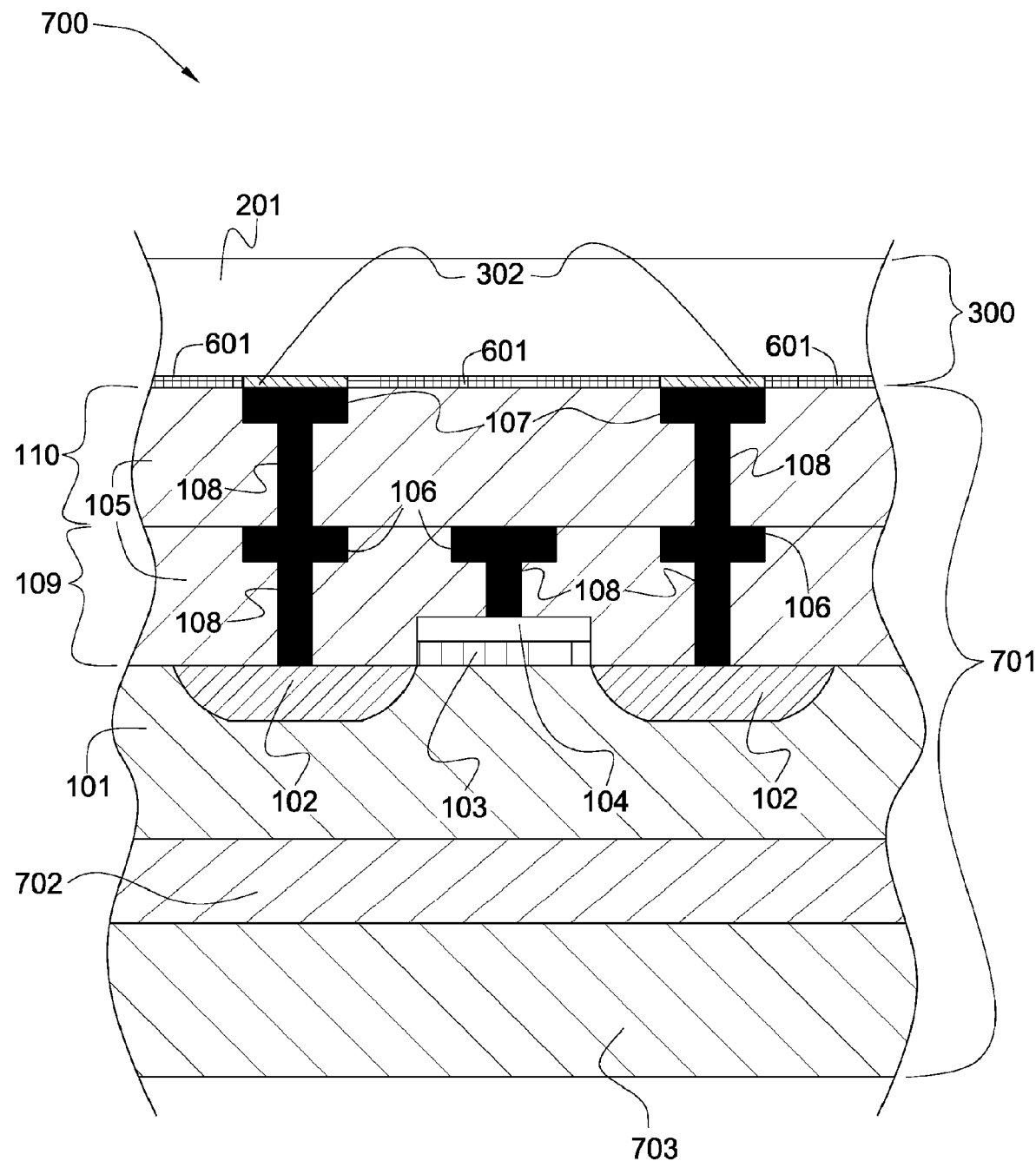
FIG. 7 is a cross-sectional diagram of another embodiment of an integrated circuit apparatus.

Referring now to FIG. 7, another integrated circuit apparatus 700 of the present invention may be implemented as a silicon-on-insulator (SOI) embodiment with a semiconductor device 701 that comprises a layer of insulator material 702 sandwiched between a first layer 101 and a second layer 703 of substrate material. The substrate material is preferably silicon. The insulator 702 may comprise silicon dioxide, diamond, silicon nitride, sapphire, or other suitable dielectric material.

An SOI embodiment of the integrated circuit apparatus 700 may be advantageous when an integrated chip apparatus is needed for high-temperature applications such as downhole drilling and aviation applications. SOI implementations of circuit designs are believed to be more suitable for high-temperature applications than other implementations because of their characteristic reduced leakage current at high temperatures.

An integrated circuit apparatus 700 with both an SOI implementation of the semiconductor device 701 and an electrically insulating heat spreader 300 according to the present invention may be especially ideal for high-temperature applications, due to its dual approach to the heat removal problem. First, the SOI structure of the semiconductor device 701 will allow the device 701 to function at high temperatures, as previously noted. Second, the thermally and electrically conducting vias 108 will conduct heat away from terminals 102, 104 of the semiconductor device 701 to the heat spreader 300. Thereby areas of the device which generate more heat are brought into thermal equilibrium with areas that generate less heat, enabling the device as a whole to operate at higher temperatures than would normally be possible.

Figure 8:
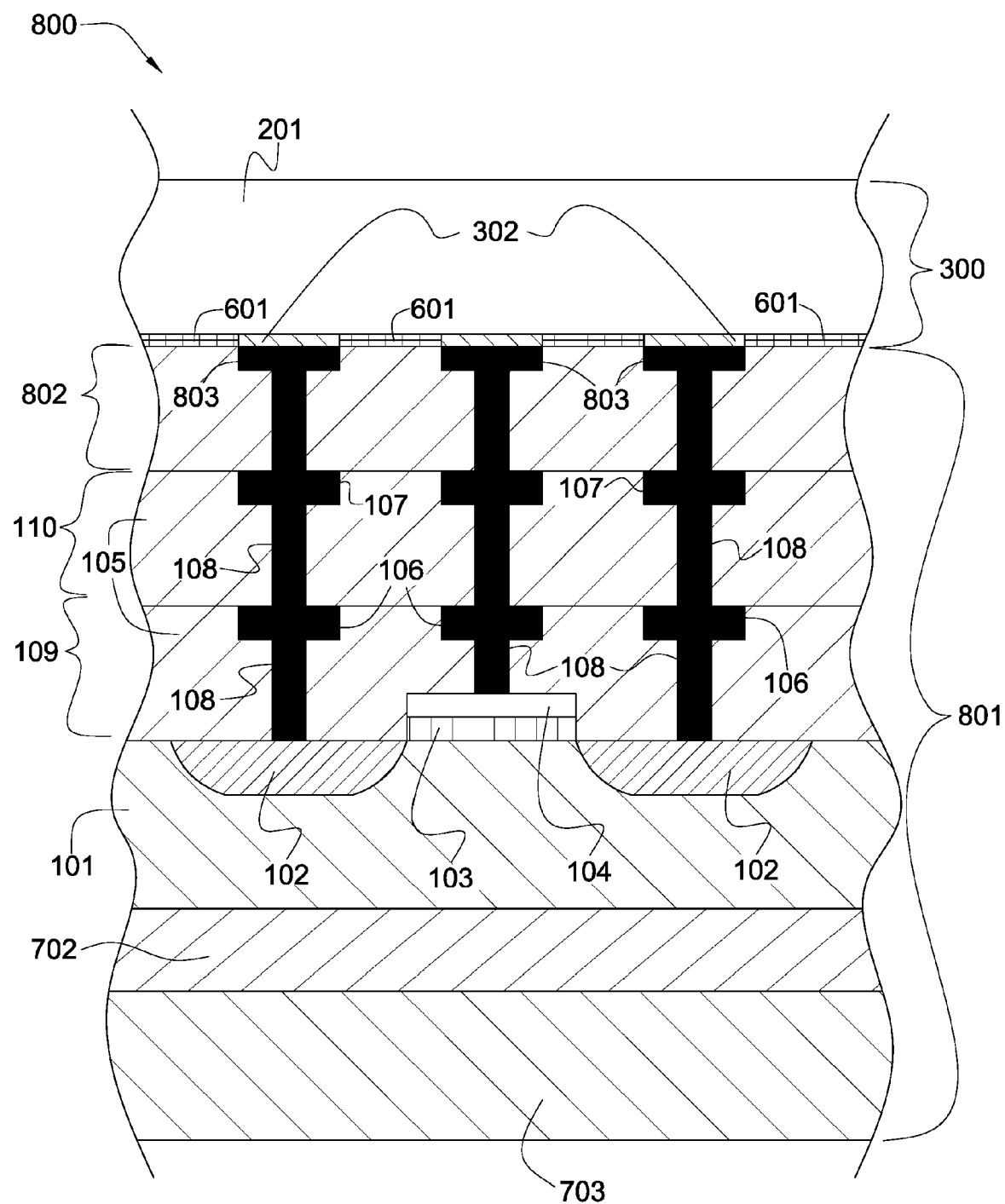
FIG. 8 is a cross-sectional diagram of another embodiment of an integrated circuit apparatus.

Referring now to FIG. 8, another embodiment of an integrated circuit apparatus 800 comprises a semiconductor device 801 with an electrical interconnection network of three electrically isolated levels 109, 110, 802. In the embodiment shown, all of the vias 108 are bonded to the heat spreader 300 at the upper layer 802, allowing heat energy produced at all of the terminals 102, 104 to be conducted up to the heat spreader 300 through the vias 108. In some embodiments it may not be necessary for one or more vias 108 to extend to the upper layer 802 in order to complete the circuit configuration of the integrated circuit apparatus 800. However, the vias 108 may still extend to the upper layer 802 and bond with the heat spreader 300 for heat removal purposes. In other embodiments, more than three electrically isolated layers 109, 110, 802 may be required to interconnect all of the terminals 102, 104 according to circuit design. The metallized undersurface segments 302 may provide an additional level of interconnection.

Figure 9:
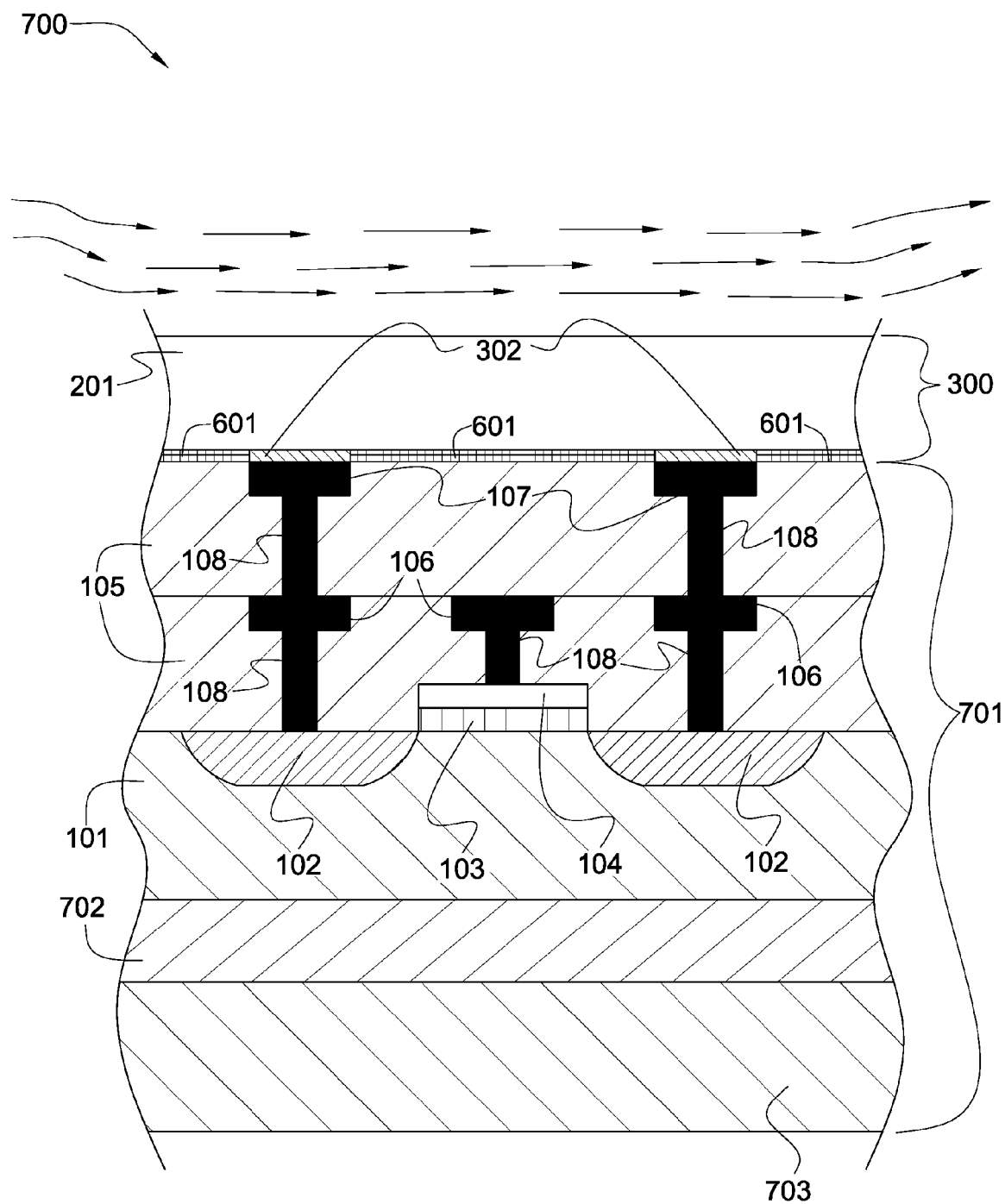
FIG. 9 is a cross-sectional diagram of a coolant circulating by an electrically insulating heat spreader in an integrated circuit apparatus.

Referring now to FIG. 9 a circulating fluid coolant (indicated by the arrows) may further aid in the dissipation of heat energy produced in the semiconductor device 701. The circulating fluid coolant may be air. In other embodiments the circulating coolant may be some other gas or liquid such as water, liquid nitrogen, etc. Heat energy will be transferred from the heat spreader 300 to the circulating coolant, resulting in more effective cooling at terminals 102, 104.

Figure 10:
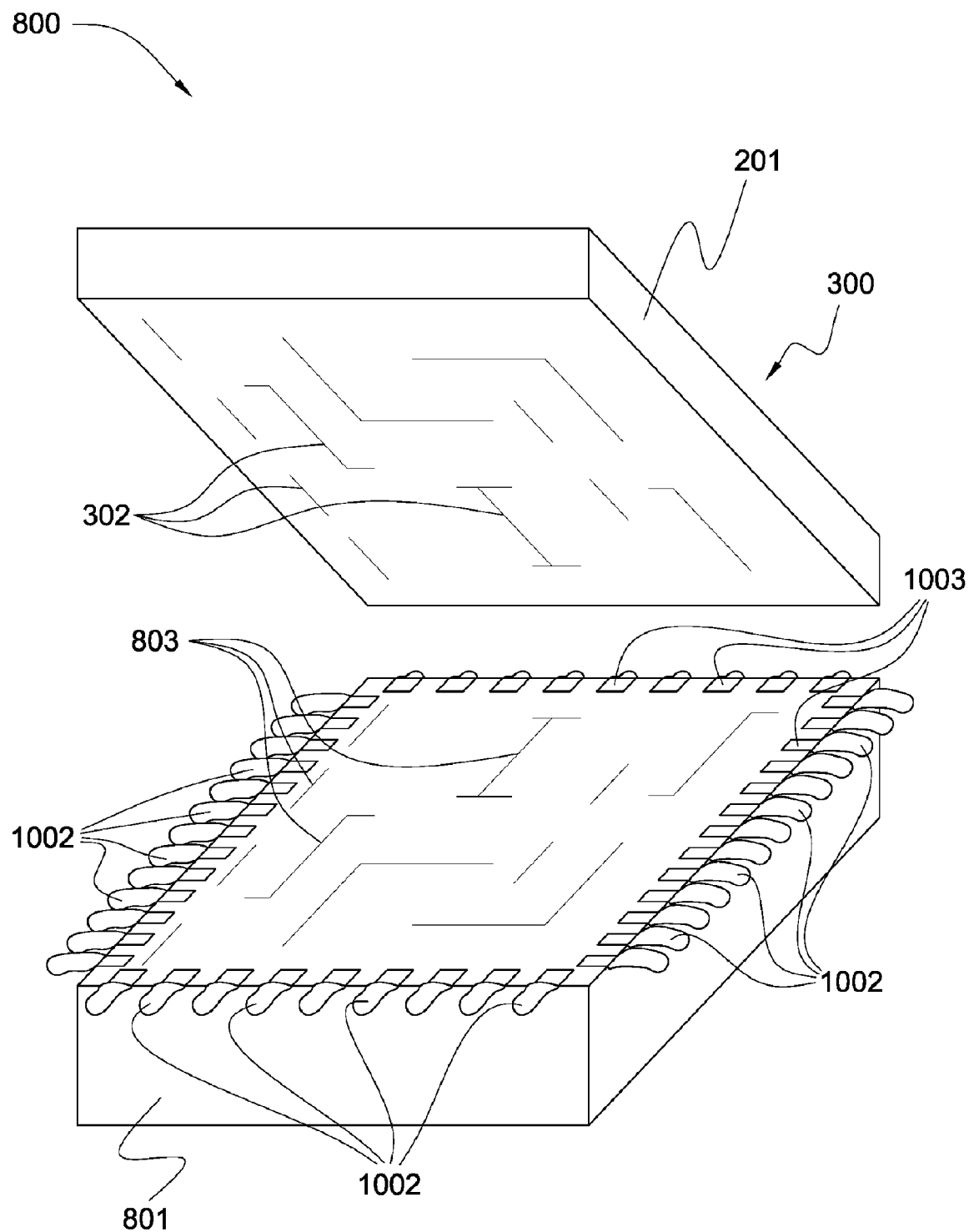
FIG. 10 is a perspective diagram of an integrated circuit apparatus and a diamond heat spreader with a metallized undersurface.
Figure 11:
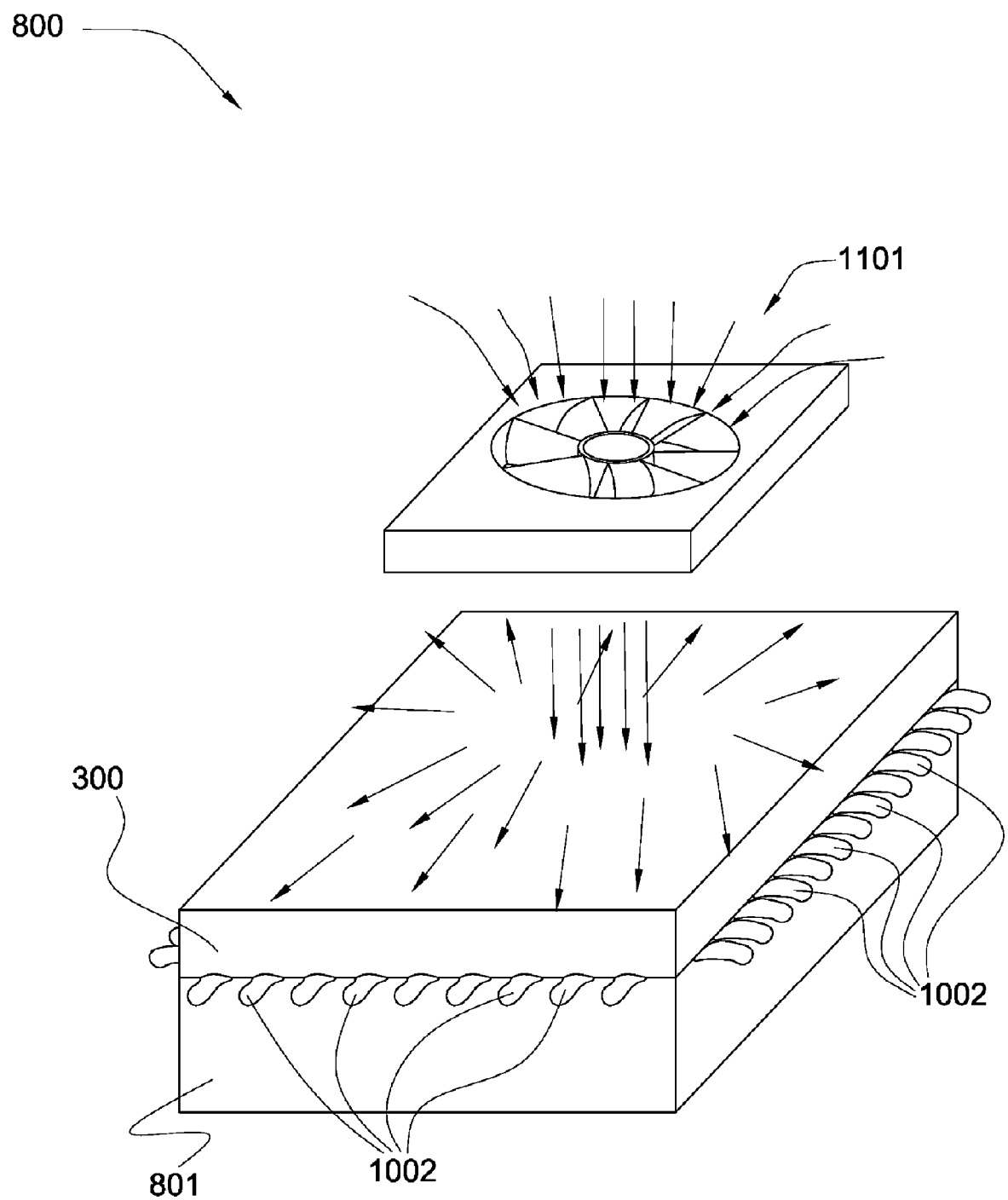
FIG. 11 is a perspective diagram of a fan circulating a fluid coolant over one embodiment of an integrated circuit apparatus.

Referring now to FIG. 10, a perspective view of the integrated circuit apparatus 800 of FIG. 8 comprising a semiconductor device 801 and an electrically insulating heat spreader 300 illustrates how metallized undersurface segments 302 on the electrically insulating thermally conducting material 201 may be configured to align with electrical conductors 803 at the upper level 802. The metallized undersurface segments 302 are preferably chemically bonded to the electrical conductors 803. The vias 108 may form part of the electrical conductors 803 and be bonded to the heat spreader 300 through the bond between the metallized undersurface segments 302 and the electrical conductors 803.

In some embodiments of the invention the upper-level 802 of the semiconductor device 801 may comprise nodes that are to be connected to either a power (Vdd) signal or a ground node. In such cases, the metallized undersurface segments 302 may correspond with nodes that are to be at a Vdd or ground potential in the semiconductor device 801. The vias 108 may also comprise terminal pads 1003. Electrical leads 1002 connected to terminal pads 1003 may serve as an interface for information and power transfer between the integrated circuit apparatus 800 and other devices (not shown).

Referring now to FIG. 1, in one embodiment, the heat spreader 300 may function as a heat sink. A fan 1101 may be used to circulate a fluid coolant (indicated by the arrows) across the surface of the heat spreader 300 to aid in the dissipation of heat from the EITC element 300 and cool the semiconductor device 801.

Figure 12:
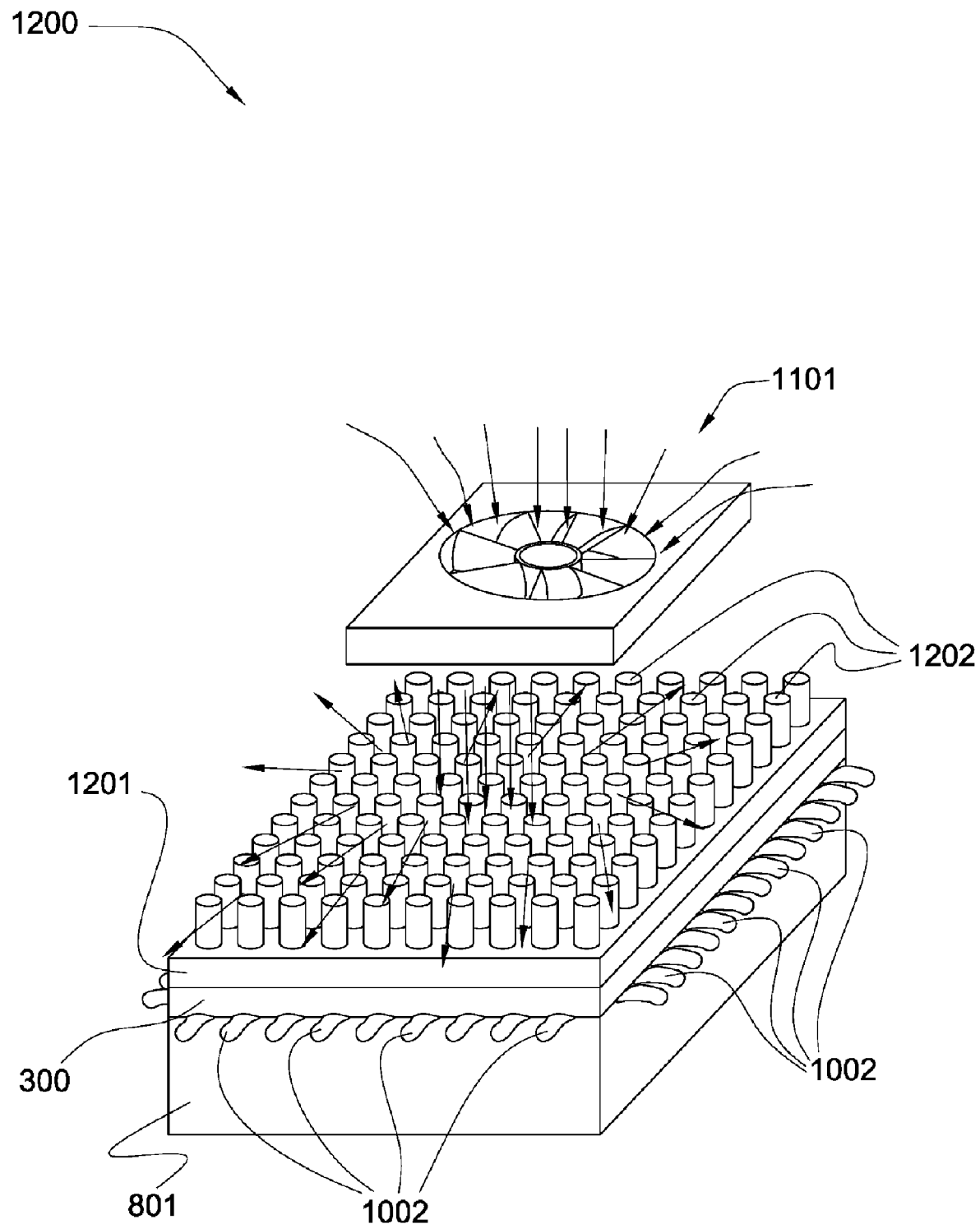
FIG. 12 is a perspective diagram of a fan circulating a fluid coolant over another embodiment of an integrated circuit apparatus.

Referring now to FIG. 12, another embodiment of an integrated circuit apparatus 1200 may comprise an electrically insulating heat spreader 300 with metallized undersurface segments 302 that bond to the vias 108 as previously described. Preferably the heat spreader 300 is a polycrystalline diamond heat spreader. The heat spreader 300 is preferably bonded to a heat sink 1201. The heat spreader 300 acts to spread heat produced by the semiconductor device 801 across its entire surface area. In this way, all regions of the heat sink 1201 may receive substantially the same amount of heat from the heat spreader 300, despite certain "hot spots" that may be present in the semiconductor device 801.

The heat sink 1201, may comprise various protrusions 1202. The protrusions 1202 may increase the surface area of the heat sink 1201 exposed to the surrounding ambient and optimize the dissipation of heat energy from the heat spreader 300 through the principles of convection. A circulating fluid coolant (indicated by the arrows) such as air may further aid in dissipating the heat.

Figure 13:
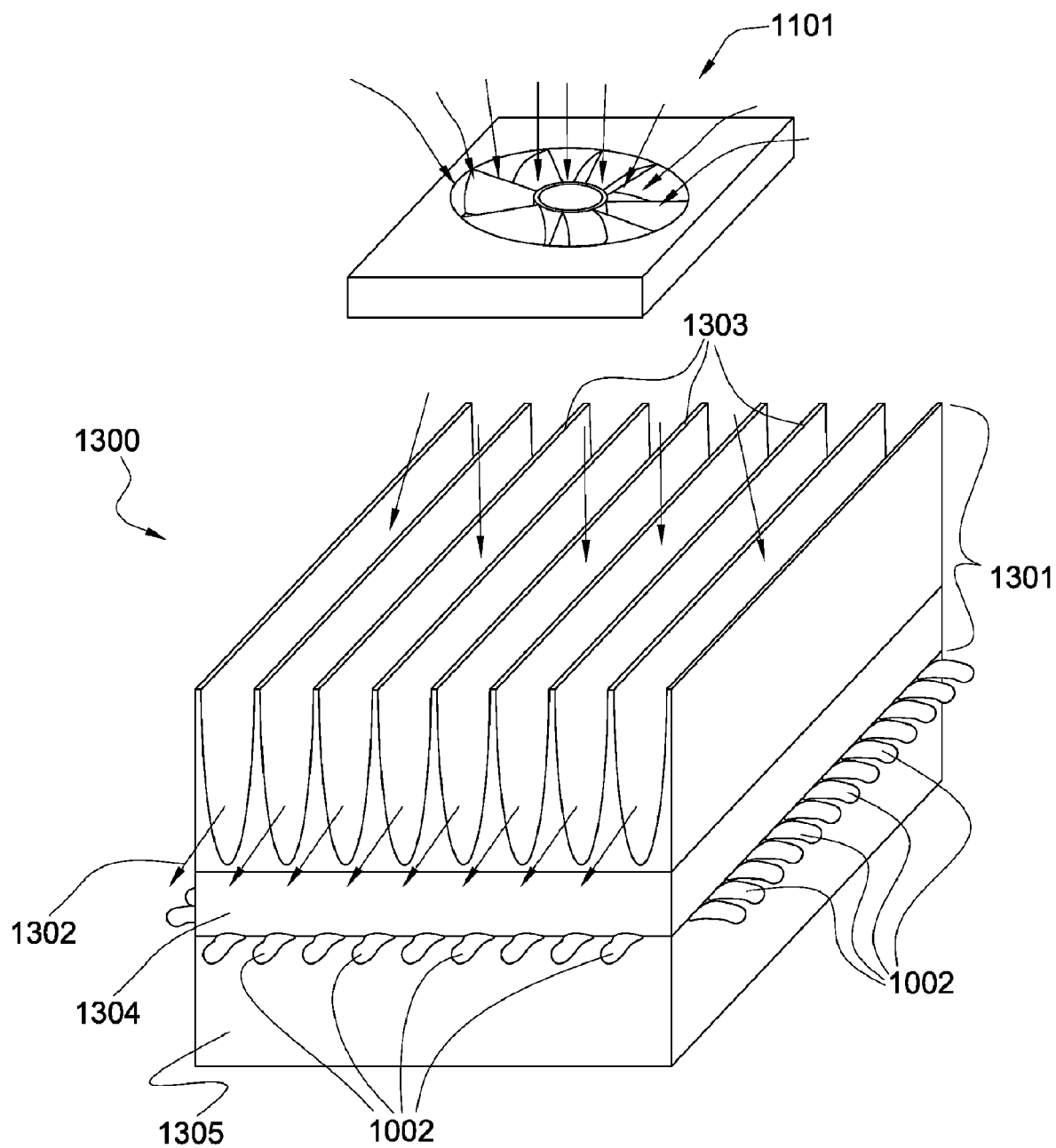
FIG. 13 is a perspective diagram of a fan circulating a fluid coolant over an integrated circuit apparatus.

Referring now to FIG. 13, another embodiment of the integrated circuit apparatus 1300 may be similar to that of FIG. 12, but with a finned heat sink 1302. The present invention may be used in conjunction with ideas disclosed in U.S. Pat. No. 6,390,181 (hereafter referred to as the '181 patent) to Hall, et al, and herein incorporated by this reference. The '181 patent teaches of a heat dissipating module 1301 made up of a tungsten carbide element 1302 comprising a plurality of fins 1303 and a polycrystalline diamond buffer element 1304 comprising a surface bonded to the tungsten carbide element 1302 and a surface bonded to an integrated circuit 1305. As a specific embodiment of the present invention, the diamond buffer element 1304 may comprise an EITC element 300 with a metallized undersurface 202 according to the foregoing disclosure and claims appended to this specification. The metallized undersurface 202 may comprise segments 302 configured to chemically bond to specific thermally and electrically conducting vias 108 in the integrated circuit 1305.

Figure 14:
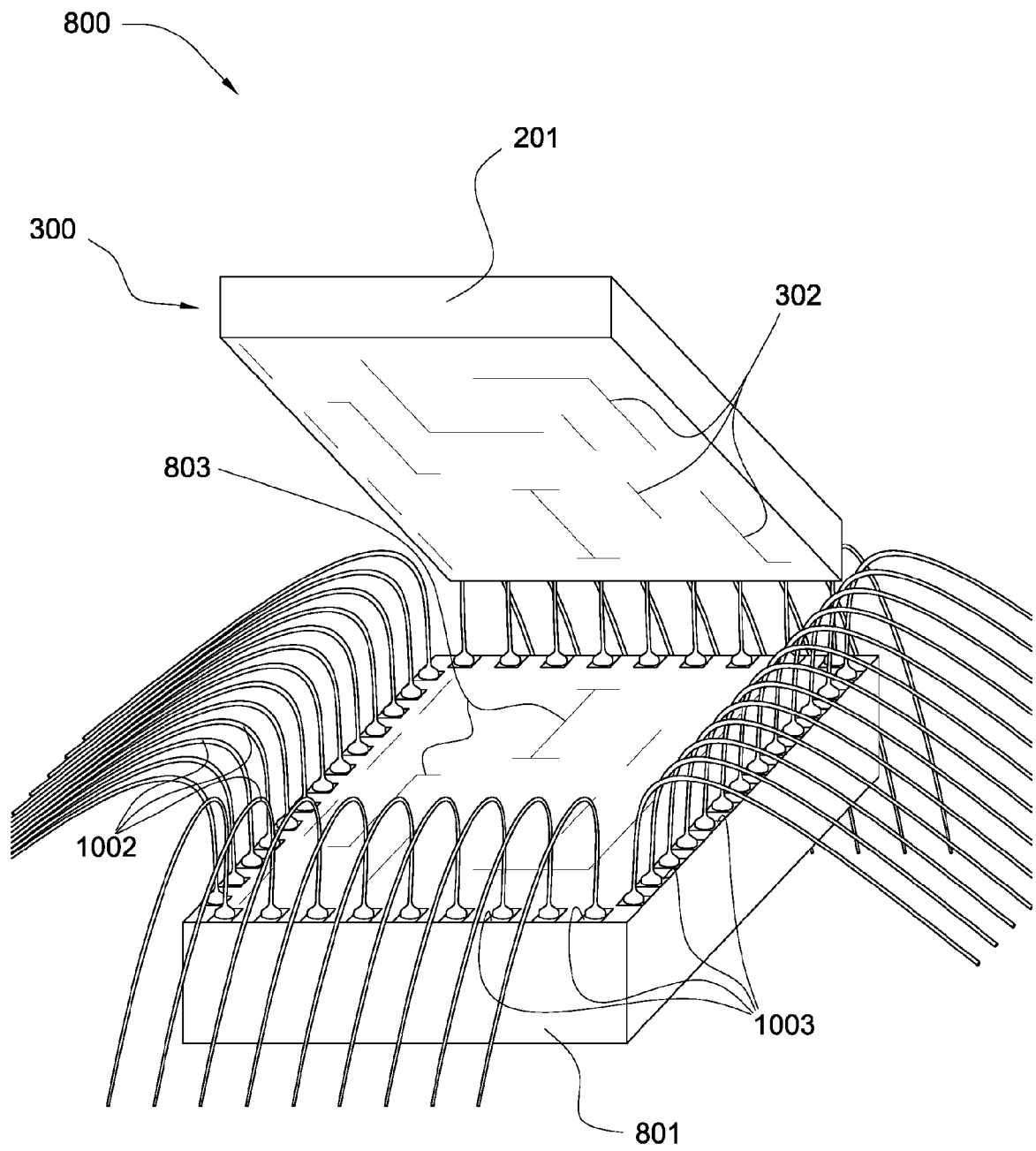
FIG. 14 is a perspective diagram of another embodiment of an integrated circuit apparatus.

Referring now to FIG. 14, another embodiment of the integrated circuit apparatus 800 comprises a heat spreader 300 adapted to bond to the vias 108 in the semiconductor device 801 without interfacing with the terminal pads 1003. In this embodiment, the semiconductor device 801 comprises a greater surface area than the heat spreader 300 at the interface. The terminal pads 1003 may bond to leads 1002 without interference from the heat spreader 300.

Figure 15:
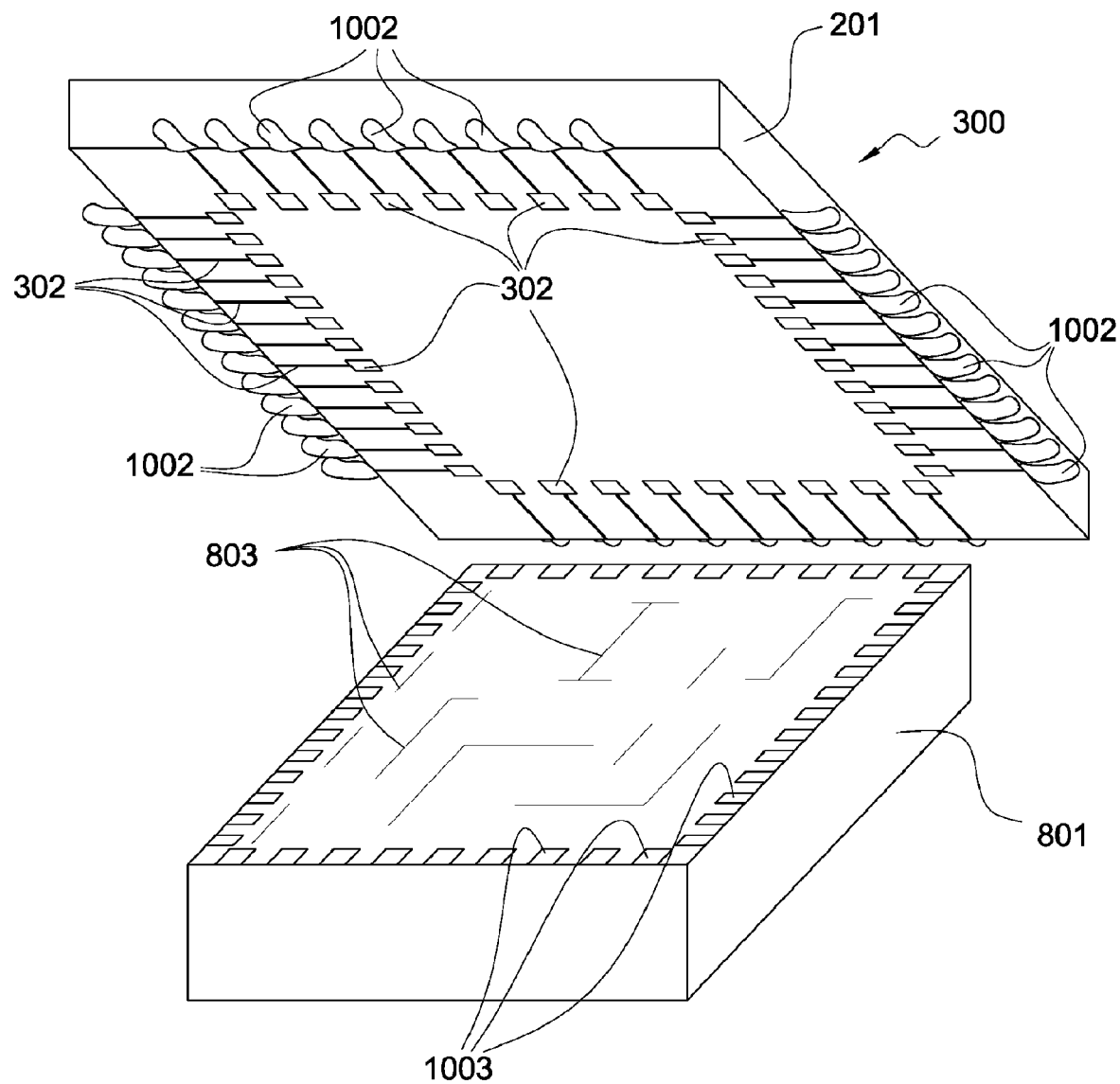
FIG. 15 is a perspective diagram of another embodiment of an integrated circuit apparatus.
Figure 16:
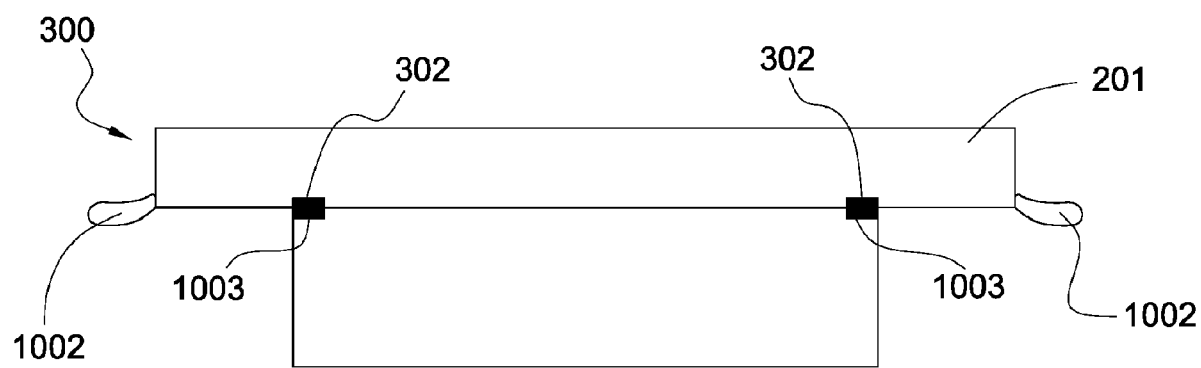
FIG. 16 is a cross-sectional diagram of the embodiment of FIG. 15.

Referring now to FIGS. 15-16, in another embodiment the integrated circuit apparatus 800 comprises a heat spreader 300 with metallized undersurface segments 302 that extend beyond the face of the semiconductor device 801. Certain vias 108 may comprise terminal pads 1003. The metallized undersurface segments 302 of this embodiment are configured to mate with the terminal pads 1003 of the semiconductor device 801 and are in electrical communication with leads 1002, thus providing interconnection of the integrated circuit apparatus 800 with outside circuits and/or signals. FIG. 16 shows a cross-sectional diagram of the embodiment of FIG. 15. In other embodiments the metallized undersurface segments 302 may be configured to mate with both the terminal pads 1003 and other vias 108 that comprise electrical conductors 803.

Figure 17:
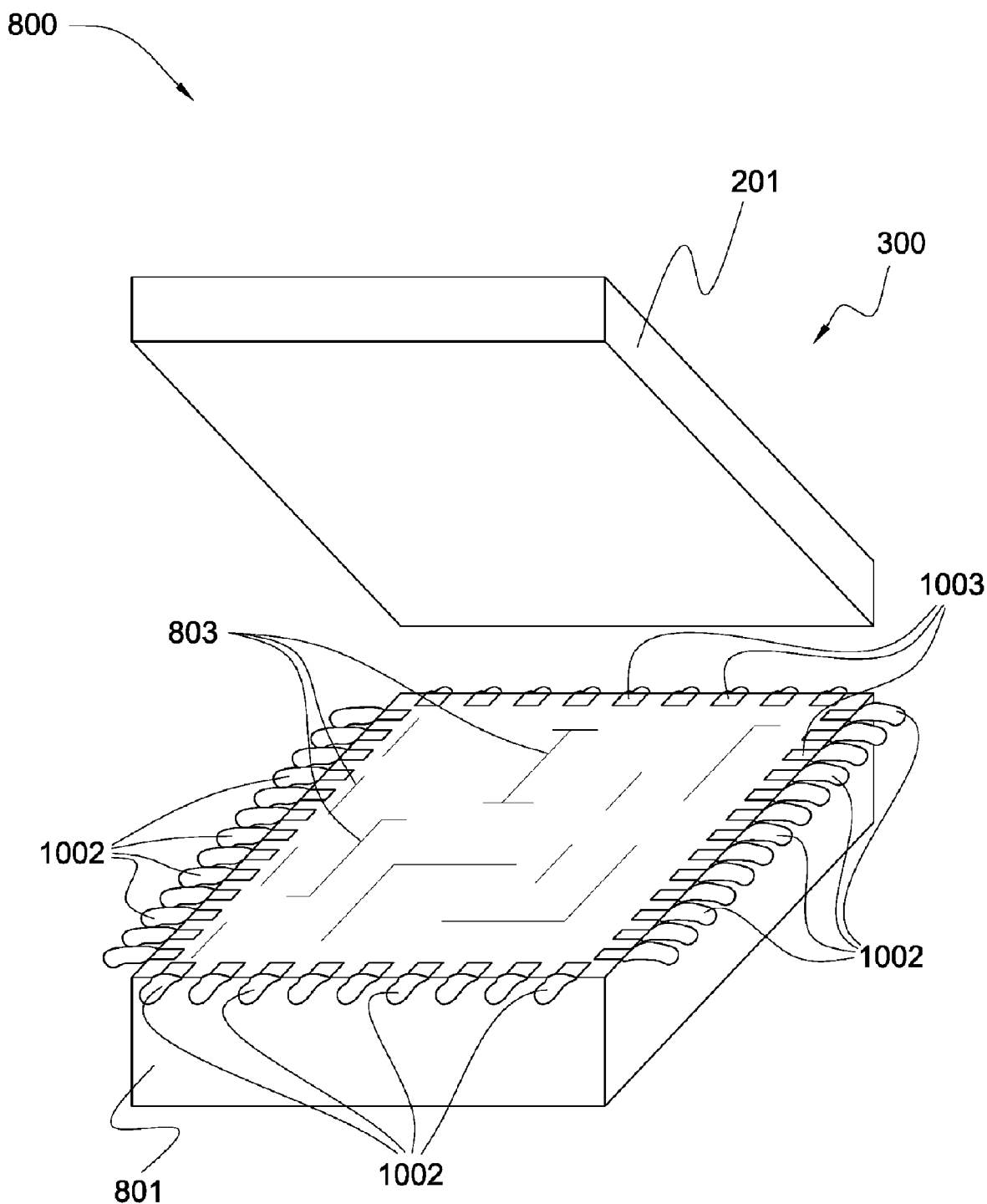
FIG. 17 is a perspective diagram of another embodiment of an integrated circuit apparatus.

Referring now to FIG. 17, in the embodiment shown, an electrically insulating heat spreader 300 does not necessarily require a metallized undersurface 202 to bond to the vias 108 of the semiconductor device 801. Temperature and pressure may be used to create a diffusion bond between the heat spreader 300 and the vias 108 and the electrical conductors 803. In this case, the heat spreader 300 is preferably made out of diamond while the vias 108 electrical conductors 803 (FIG. 8) preferably comprise a titanium alloy as titanium alloys are generally good thermal conductors and a suitable material for forming a diffusion bond with diamond.

Whereas the present invention has been described in particular relation to the drawings attached hereto, it should be understood that other and further modifications apart from those shown or suggested herein, may be made within the scope and spirit of the present invention.

What is claimed is:

1. An integrated circuit apparatus comprising:
   an electrical interconnection network of a plurality of electrically and thermally conductive vias in thermal communication with at least one transistor gate terminal of at least one semiconductor device;
   an electrically insulating heat spreader bonded to at least one of the vias at an upper layer through a metallized undersurface of the heat spreader;
   wherein the metallized undersurface is segmented such that at the upper layer the vias are electrically isolated from each other.

2. The apparatus of claim 1, wherein the electrically and thermally conductive vias comprise at least one material selected from the group consisting of titanium, tungsten, gold, silver, aluminum, copper, and alloys thereof.

3. The apparatus of claim 1, further comprising a diffusion bond between the electrically insulating heat spreader and the vias.

4. The apparatus of claim 1, wherein the electrically insulating heat spreader comprises diamond.

5. The apparatus of claim 4, wherein the diamond comprises polycrystalline diamond.

6. The apparatus of claim 1, farther comprising a chemical bond between the metallized undersurface and the vias.

7. The apparatus of claim 6, wherein the chemical bond is selected from the group consisting of solder joints, diffusion bonds, fusion bonds, and combinations thereof.

8. The apparatus of claim 1, wherein the metallized undersurface is etched away between vias.

9. The apparatus of claim 1, wherein the metallized undersurface is in electrical communication with a power node.

10. The apparatus of claim 1, wherein the metallized undersurface is in electrical communication with a ground node.

11. The apparatus of claim 1, wherein the metallized undersurface provides interconnection of the integrated circuit to external circuits.

12. The apparatus of claim 1, wherein the metallized undersurface comprises at least one material selected from the group consisting of aluminum, nickel, titanium, tungsten, gold, silver, copper, nickel and alloys thereof.

13. The apparatus of claim 1, wherein the electrically insulating heat spreader further comprises arched recesses between vias.

14. The apparatus of claim 1, wherein the electrical interconnection network comprises a plurality of electrically isolated levels with electrical conductors interconnecting specific electrical vias according to a circuit configuration.

15. The apparatus of claim 14, wherein the electrically isolated levels are separated by a dielectric material.

16. The apparatus of claim 1, wherein the terminal comprise at least one element selected from the group consisting of doped wells, transistor gate structures, anodes, cathodes, drains, sources, collectors, emitters, bases, and substrates.

17. The apparatus of claim 1, wherein the electrically insulating heat spreader is chemically bonded to substantially all of the vias at the upper layer.

18. The apparatus of claim 1, wherein the electrically insulating heat spreader is actively cooled by a fluid.

19. An integrated circuit apparatus comprising:
    an electrical interconnection network comprising a plurality of electrically isolated levels with electrical conductors interconnecting specific electrically and thermally conductive vias according to a circuit configuration;
    the vias in thermal communication with a transister gate terminal of at least one semiconductor device;
    an electrically insulating heat spreader comprising a segmented metallized undersurface chemically bonded to at least one of the vias at an upper layer and etched away between vias;
    a heat sink bonded to the electrically insulating heat spreader;
    wherein the metallized undersurface is segmented such that at the upper layer the vias are electrically isolated from each other.

20. The apparatus of claim 19, wherein the electrically insulating heat spreader comprises diamond.

21. The apparatus of claim 20, wherein the diamond heat spreader comprises polycrystalline diamond.

22. The apparatus of claim 19, wherein the electrically isolated levels are separated by a dielectric material.

23. The apparatus of claim 19, wherein the electrically and thermally conductive vias comprise at least one material selected from the group consisting of tungsten, gold, silver, aluminum, copper, and alloys thereof.

24. The apparatus of claim 19, wherein the heat sink is actively cooled by a fluid.

* * * * *